(12) United States Patent
Gustavsen et al.

(10) Patent No.: US 8,155,934 B2
(45) Date of Patent: Apr. 10, 2012

(54) PASSIVITY ENFORCEMENT BY MODAL PERTURBATION

(75) Inventors: Bjorn Gustavsen, Trondheim (NO); Christoph Heitz, Elgg/ZH (CH); Martin Tiberg, Genève (CH)

(73) Assignee: ABB Technology AG, Zurich (CH)

( * ) Notice: Subject to any disclaimer, the term of this patent is extended or adjusted under 35 U.S.C. 154(b) by 335 days.

(21) Appl. No.: 12/616,458

(22) Filed: Nov. 11, 2009

(65) Prior Publication Data

US 2010/0106474 A1    Apr. 29, 2010

Related U.S. Application Data

(63) Continuation of application No. PCT/EP2007/054593, filed on May 11, 2007.

(51) Int. Cl.
*G06F 7/60* (2006.01)
*G06F 17/10* (2006.01)
(52) U.S. Cl. .......................................................... 703/2
(58) Field of Classification Search ....................... 703/2
See application file for complete search history.

(56) References Cited

OTHER PUBLICATIONS

Bjorn Gustavsen, "Rational approximation of frequency domain responses by vector fitting", 1999.*
Bjorn Gustavsen, "Computer code for passivity enforcement of rational macromodels", 2005.*
Bjorn Gustavsen, "Rational modeling of multiport systems by modal vector fitting", May 13-16, 2007.*
Bjorn Gustavsen, "simulation of transmission line transients using vector fitting and modal decompositon", IEEE 1997.*
Bjorn Gustavsen, "A robust approach for system identification in the frequency domain", IEEE 2004.*
Bjorn Gustavsen, "Relaxed vector fitting algorithm for rational approximation of frequency domain responses", IEEE 2006.*
Bjorn Gustavsen, "Improving the Pole relocating properties of vector fitting", IEEE 2006.*
Bjorn Gustavsen, "Enforcing Passivity for Admittance Matrice Approximated by rational functions", IEEE 2001.*
International Preliminary Report on Patentability (Form PCT/IB/373) and Written Opinion (Form PCT/ISA/237) issued in PCT/EP2007/054593, Nov. 17, 2009, The International Bureau of WIPO, Geneva, CH.
International Search Report for PCT/EP2007/054593, mailed Mar. 11, 2008.
Written Opinion of the International Searching Authority for PCT/EP2007/054593, mailed Mar. 11, 2008.
Bjørn Gustavsen et al., "Computer code for passivity enforcement of rational macromodels," slides shown at Signal Propagation on Interconnects, 2005, SINTEF Energy Research, Norway.
Stefano Grivet-Talocia, "Passivity Enforcement via Perturbation of Hamiltonian Matrices," IEEE Transactions on Circuits and Systems, Sep. 2004, pp. 1755-1769, vol. 51, No. 9, IEEE Inc., New York.
D. Saraswat et al., "Enforcing Passivity for Rational Function Based Macromodels of Tabulated Data," Electrical Performance of Electronic Packaging, Oct. 27-29, 2003, pp. 295-298, IEEE, Piscataway, New Jersey.
Bjørn Gustavsen et al., "Enforcing Passivity for Admittance Matrices Approximated by Rational Functions," IEEE Transactions on Power Systems, Feb. 2001, pp. 97-104, vol. 16, No. 1, IEEE Service Center, Piscataway, NJ.
B. Gustavsen, "Passivity Enforcement of Rational Models Via Modal Perturbation," IEEE Transactions on Power Delivery, Apr. 2008, pp. 768-775, vol. 23, No. 2, IEEE.
Bjørn Gustavsen, "Fast Passivity Enforcement of Rational Macromodels by Perturbation of Residue Matrix Eigenvalues," Proc. 11th IEEE Workshop on Signal Propagation on Interconnects, May 2007, pp. 71-74, Genova, Italy.

* cited by examiner

*Primary Examiner* — David Silver
*Assistant Examiner* — Angel Calle
(74) *Attorney, Agent, or Firm* — Buchanan Ingersoll & Rooney PC

(57) ABSTRACT

Residue perturbation is used for enforcing passivity of a linear response model of an electrical component having n>1 ports. According to an exemplary embodiment, a modal perturbation approach can be used, which allows weighted perturbation of the individual modes by the inverse of the corresponding eigenvalues. This provides superior results if the admittance or impedance matrix of the device has a large eigenvalue spread.

20 Claims, No Drawings

PASSIVITY ENFORCEMENT BY MODAL PERTURBATION

RELATED APPLICATIONS

This application claims priority as a continuation application under 35 U.S.C. §120 to PCT/EP2007/054593 filed as an International Application on May 11, 2007 designating the U.S., the entire content of which is hereby incorporated by reference in its entirety.

FIELD

The present disclosure relates to a method of modeling linear properties of an electrical component with passivity enforcement.

BACKGROUND INFORMATION

Residue perturbation (RP) is often used as a means for enforcing passivity of models describing the linear properties of electrical components. One known RP approach uses quadratic programming (QP) for solving a least squares problem with constraints.

As an example, consider a pole-residue model of an admittance matrix Y.

$$Y(s) = \sum_{m=1}^{N} \frac{R_m}{s - a_m} + D, \tag{1}$$

wherein s is the angular frequency, $R_m$ with m=1 to N are matrices independent of s (with N being the number of poles or resonances taken into account, N<∞), D is a matrix independent of s, and $a_m$ with m=1 to N are the complex angular frequencies of the poles or resonances.

The model parameters are to be perturbed so that the perturbed model satisfies the passivity criterion that the real part of the eigenvalues of Y is positive for all frequencies, i.e.

$$eig\left(Re\left\{Y + \sum_{m=1}^{N} \frac{\Delta R_m}{s - a_m} + \Delta D\right\}\right) > 0 \tag{2a}$$

The perturbation is to be done so as to minimize the change to the original model, i.e.

$$\Delta Y = \sum_{m=1}^{N} \frac{\Delta R_m}{s - a_m} + \Delta D \cong 0 \tag{2b}$$

The known way of handling equation (2b) is to minimize the change to ΔY in the least squares sense.

SUMMARY

An exemplary embodiment provides a method of modeling linear properties of an electrical component having n>1 ports, whose linear properties are described in a matrix Y relating a voltage applied to the ports to a current through the ports. A dependence of Y on an independent variable s can be approximated by a model $$Y = F(s, p_1, \ldots, p_K), \tag{1.1}$$

where $p_1, \ldots, p_K$ are parameters of the model, and F is a matrix-valued function describing the dependence of Y on the variable s. The exemplary method can include a passivation step of ensuring a passivity of the model by perturbing the parameters $p_1, \ldots, p_K$ to a perturbed set of parameters $p_1 + \Delta p_1, \ldots, p_K + \Delta p_K$ while ensuring that the perturbed set of parameters fulfils a Boolean valued condition function $$C(p_1 + \Delta p_1, \ldots, p_K + \Delta p_K) = \text{true}, \tag{1.2}$$

According to an exemplary embodiment, the passivation step includes the step of finding an approximate solution for the equations $$[F(s, p_1 + \Delta p_1, \ldots, p_K + \Delta p_K) - F(s, p_1, \ldots, p_K)] \cdot \frac{t_i}{|\lambda_i|} \cong 0, \tag{1.3}$$

for i=1 . . . n, wherein $t_i$ and $\lambda_i$ are the eigenvectors and eigenvalues of matrix Y.

DETAILED DESCRIPTION

Exemplary embodiments of the present disclosure provide a method of modeling linear properties of an electrical component, with improved accuracy over the known techniques.

A weakness of the prior art approach is that the small eigenvalues of Y can easily become corrupted by the perturbation (ΔY). Exemplary embodiments of the present disclosure overcome this problem. For example, one or more exemplary embodiments described hereinafter utilize "modal perturbation", to an approximate solution to the problem $$[F(s, p_1 + \Delta p_1, \ldots, p_K + \Delta p_K) - F(s, p_1, \ldots, p_K)] \cdot \frac{t_i}{|\lambda_i|} \cong 0, \tag{3}$$

wherein F is the function describing the dependence of matrix Y on the independent variable s, while $p_1 \ldots p_K$ are parameters (which are to be perturbed) of the model. $t_i$ and $\lambda_i$ are the eigenvectors and eigenvalues of matrix Y, with i=1 . . . n, and with n being the number of independent ports of the electrical component (device) (n<∞).

For the pole residue model, function F is expressed by equation (1) and the parameters $p_1 \ldots p_K$ can, for example, correspond to the elements of the matrices $R_m$ and D.

In addition to equation (3), a constraint ensuring the passivity of matrix Y is taken into consideration, similar to equation (2a). According to an exemplary embodiment of the present disclosure, a generalized version of equation (2a) can be formulated by requesting that the perturbed set of parameters $p_1 + \Delta p_1, \ldots, p_K + \Delta p_K$ fulfils a suitable Boolean valued condition function C $$C(p_1 + \Delta p_1, \ldots, p_K + \Delta p_K) = \text{true}. \tag{4}$$

The approximate solution to the n vector equation (3) can be found, for example, by minimizing the sum of the squares of each vector coordinate of each of said equations under the condition of equation (4).

The constraint expressed by condition function C can, for example, be the constraint according to equation (2a). The constraint expressed by condition function C can also be another suitable constraint, such as one obtained by using the Hamiltonian matrix eigenvalues, as described, for example, in S. Grivet-Talocia, "Passivity enforcement via perturbation of Hamiltonian matrices", IEEE Trans. Circuits and Systems I, vol. 51, no. 9, pp. 1755-1769, September 2004.

Modeling the Device

Exemplary embodiments of the present disclosure relate to the modeling of the linear electrical properties of an n-port electrical component.

The term "electrical component" is to be understood broadly and can relate to an individual device, such as a transformer, or to an assembly of several devices, such as a system of transformers, motors, etc. interconnected by electrical communication lines, such as power lines, for example.

The linear electrical properties of such a device can be expressed by an n×n matrix Y, which can relate the voltage applied to the port to the current flowing therethrough. Matrix Y can be the admittance matrix as described above, but it can also be, for example, the impedance matrix (usually called Z) or the scattering matrix (usually called S) of the device. Hence, even though matrix Y can be the admittance matrix according to one exemplary embodiment, it can also describe any other type of linear response of the device.

The model describes the dependence of matrix Y on an independent variable s, which can be the frequency, but independent variable s can alternatively be, for example, the time or the discrete z-domain. Hence, even though the independent variable s can be the frequency according to one exemplary embodiment, it can also be any other independent variable the dependence on which is described by the model.

The dependence of matrix Y on independent variable s can, for example, be described by the pole-residue model of equation (1). This model has several parameters that are to be perturbed for ensuring passivity. In the example of equation (1), these parameters are the matrix elements of the matrices $R_m$ and D. Alternatively, the parameters can also be the eigenvalues of the matrices $R_m$ and D, for example. Also, it is possible to perturb the pole frequencies $a_i$ as well.

It is to be understood, though, that equation (1) is not the only model that can be used for the description of matrix Y in the context of the present disclosure. For example, equation (1) can be refined by adding a further term, namely s·E with an n×n matrix E describing a linear dependence of matrix Y on independent variable s.

In more general terms, the dependence of matrix Y on s can be described by the matrix-valued function F defined above, i.e.

$$Y = F(s, p_1, \ldots, p_K), \quad (5)$$

with $p_1, \ldots, p_K$ being those parameters of the model that are to be perturbed for passivity enforcement.

According to an exemplary embodiment, function F can be a polynomial function, a rational function, or a sum of polynomial and/or rational functions.

According to an exemplary embodiment, function F can be a rational function, such as one given as a ratio between two polynomials in s, a pole residue model, a state-space model, or any combinations of these.

Passivity Enforcement

The parameters can be perturbed in such a way that matrix Y becomes passive. "Perturbation" in this context means that the parameters $p_1, \ldots, p_K$ are (slightly) offset to become a perturbed set of parameters $p_1 + \Delta p_1, \ldots, p_K + \Delta p_K$.

If, for example, matrix Y is the admittance matrix, passivity can be achieved for a perturbed set of parameters if the following condition is met $$eig_i(Re[F(s, p_1+\Delta p_1, \ldots, p_K+\Delta p_K)]) > 0 \text{ for all } i = 1 \text{ to } n, \quad (6)$$

wherein $eig_i(\ )$ is an operator returning eigenvalue i of its matrix-valued argument. If function F is the pole-residue model of equation (1) and if the perturbation changes the matrices $R_m$ and D only, this yields $$eig_i\left(Re\left[Y + \sum_{m=1}^{n} \frac{\Delta R_m}{s - a_m} + \Delta D\right]\right) > 0, \quad (7)$$

with $\Delta R_m$ and $\Delta D$ being the changes introduced in the matrices R and D due to the perturbation.

In the case of equation (1), this is equivalent to the condition of equation (2a). However, it is to be understood that there are other conditions that ensure a passivity of matrix Y, such as the constraints obtained from the Hamiltonian matrix eigenvalues as mentioned above, for example. Thus, in a more generalized form, the condition that the matrix Y of the perturbed set of parameters $p_1+\Delta p_1, \ldots, p_K+\Delta p_K$ is passive, can be expressed by a Boolean valued condition function C depending on the perturbed set of parameters $p_1+\Delta p_1, \ldots, p_K+\Delta p_K$. For example, by suitably defining the condition function C, passivity is achieved if $$C(p_1+\Delta p_1, \ldots, p_K+\Delta p_K) = \text{true}. \quad (8)$$

Perturbation Algorithm

According to an exemplary embodiment, a purpose of the perturbation algorithm described here is to find a perturbed set of parameters $p_1+\Delta p_1, \ldots, p_K+\Delta p_K$ that fulfils equation (6) or, in more general terms, equation (8), under the condition that the perturbation is kept "as small as possible."

One approach taken by exemplary embodiments of the present disclosure is motivated by the fact that matrix Y can be diagonalized by transforming it by the matrix of its eigenvectors T. Namely $$Y = T \Lambda T^{-1}, \quad (9)$$

with $\Lambda$ being a diagonal matrix having the eigenvalues of Y as its non-zero elements, and T being an n×n matrix formed by placing the n eigenvectors $t_i$ of matrix Y into its columns. Postmultiplying equation (9) with T and taking first order derivatives while ignoring terms involving $\Delta T$ gives, for each pair $(\lambda_i, t_i)$ $$\Delta Y \cdot t_i \cong \Delta \lambda_i \cdot t_i \quad (10)$$

In other words, a perturbation of matrix Y can lead to a corresponding linear perturbation of each mode or eigenspace.

Exemplary embodiments of the present disclosure are based on the understanding that the perturbation should be kept "as small as possible." For example, the perturbation of each mode can be weighted by the inverse of its eigenvalue, according to at least one exemplary embodiment.

For the example of the pole-residue model of equation (7), this means that the error in the following equations is to be minimized $$\left(\sum_{m=1}^{n} \frac{\Delta R_m}{s - a_m} + \Delta D\right) \frac{t_i(s)}{|\lambda_i(s)|} \cong 0 \text{ for } i = 1 \ldots n, \quad (11)$$

In the more general example of equation (5), this corresponds to $$[F(s, p_1 + \Delta p_1, \ldots, p_K + \Delta p_K) - F(s, p_1, \ldots, p_K)] \cdot \frac{t_i}{|\lambda_i|} \cong 0, \quad (12)$$

Hence, a purpose of the perturbation algorithm is to find an approximate solution to the equations (12) or, for the example of the pole-residue model, the solution to the equations (11), for all i=1 to n. Since, for each i, we have a vector-valued equation, this means that totally n×n scalar equations can be approximated, while observing one of the conditions (6) through (8).

Such an approximation can be carried out, for example, by minimizing the sum of the squares of the errors of all equations using Quadratic Programming algorithms.

Many of these minimization algorithms assume that the equations to be approximated are linear in the parameters to be perturbed. This is already the case for the example of equation (11). For the general case of equation (12), this may not necessarily be true. For example, if the pole-residue model of equation (1) is used but the pole frequencies $a_m$ are varied as well, equation (11) becomes non-linear in the perturbed parameters $\Delta a_m$. In this case, the equations have to be linearized before they can be fed to standard Quadratic Programming algorithms. For the general case of equation (12), this linearization can be expressed as $$\left[\Delta p_1 \cdot \frac{\partial}{\partial p_1} F(s, p_1, \ldots, p_K) + \ldots + \Delta p_K \cdot \frac{\partial}{\partial p_K} F(s, p_1, \ldots, p_K)\right] \cdot \frac{t_i}{|\lambda_i|} \cong 0 \quad (13)$$

The derivatives in equation (13) can be calculated prior to feeding the data to the Quadratic Programming algorithm. Also, the values of the eigenvectors $t_i$ and the eigenvalues $\lambda_i$, which are those of the unperturbed matrix Y, can be calculated prior to optimization.

As an alternative to minimizing the errors of equations (13) in the least squares sense, any other suitable measure (norm) of each vector element of each of the equations (13) can be used instead.

According to the present disclosure, an exemplary method of modeling linear properties of an electrical component greatly reduces the problem of the perturbation corrupting the model behavior when applied in a simulation with arbitrary terminal conditions, such as if matrix Y has a large eigenvalue spread, for example. This can be achieved by formulating the least squares part of the constrained optimization problem such that the perturbation size of the admittance eigenvalues is inversely proportional to the eigenvalue size. This way, it is possible to avoid the corruption of small eigenvalues. Applications to models having a large passivity violation show that the exemplary embodiments of the present disclosure retain the behavior of the original model while large deviations result with alternative approaches. The modal perturbation approach is computationally more expensive than alternative methods and is advantageously used with a sparse solver for the Quadratic Programming problem.

Thus, it will be appreciated by those skilled in the art that the present invention can be embodied in other specific forms without departing from the spirit or essential characteristics thereof. The presently disclosed embodiments are therefore considered in all respects to be illustrative and not restrictive. The scope of the invention is indicated by the appended claims rather than the foregoing description and all changes that come within the meaning and range and equivalence thereof are intended to be embraced therein.

What is claimed is:

1. A method comprising:
computer implemented modeling of linear properties of an electrical component having n >1 ports, whose linear properties are described in a matrix Y relating a voltage applied to the ports to a current through the ports, wherein a dependence of Y on an independent variable s is approximated by a model $$Y = F(s, p_1, \ldots, p_K), \quad [1.1]$$

with $p_1, \ldots, p_K$ being parameters of the model and F being a matrix-valued function describing the dependence of Y on the variable s, said method comprising a passivation step of ensuring a passivity of said model by perturbing said parameters $p_1, \ldots, p_K$ to a perturbed set of parameters $p_1 + \Delta p_1, \ldots, p_K + \Delta p_K$ while ensuring that the perturbed set of parameters fulfills a Boolean valued condition function $$C(p_1 + \Delta p_1, \ldots, p_K + \Delta p_K) = \text{true}, \quad [1.2]$$

wherein said passivation step comprises the step of finding an approximate solution for the equations $$[F(s, p_1 + \Delta p_1, \ldots, p_K + \Delta p_K) - F(s, p_1, \ldots, p_K)] \cdot \frac{t_i}{|\lambda_i|} \cong 0, \quad [1.3]$$

for i=1 . . . n, wherein $t_i$ and $\lambda_i$ are the eigenvectors and eigenvalues of matrix Y.

2. The method of claim 1 wherein equation 1.3 is linearized by $$\left[\Delta p_1 \cdot \frac{\partial}{\partial p_1} F(s, p_1, \ldots, p_K) + \ldots + \Delta p_K \cdot \frac{\partial}{\partial p_K} F(s, p_1, \ldots, p_K)\right] \cdot \frac{t_i}{|\lambda_i|} \cong 0. \quad [2.1]$$

3. The method of claim 2, wherein the condition function C is $$eig_i(Re[F(s, p_1+\Delta p_1, \ldots, p_K+\Delta p_K)]) > 0 \text{ for all } i = 1 \ldots n$$

wherein $eig_i()$ is an operator returning eigenvalue i of its matrix-valued argument.

4. The method of claim 1, wherein the condition function C is $$eig_i(Re[F(s, p_1+\Delta p_1, \ldots, p_K+\Delta p_K)]) > 0 \text{ for all } i = 1 \ldots n$$

wherein $eig_i()$ is an operator returning eigenvalue i of its matrix-valued argument.

5. The method of claim 1, wherein said function F is a function from the group consisting of rational functions, ratio of polynomials, pole-residue functions, state-space models, and combinations thereof.

6. The method of claim 5 wherein equation 1.1 is $$Y = \sum_{m=1}^{N} \frac{R_m}{s - a_m} + D,$$

wherein $R_m$ with m=1 to N are matrices independent of s, N is the number of poles or resonances taken into account, D is a matrix independent of s, and $a_m$ with m=1 to N are the complex angular frequencies of the poles or resonances, wherein at least one of said matrices $R_m$, D and said poles $a_m$ depend on said parameters $p_1, \ldots, p_K$.

7. The method of claim 6, wherein said matrix Y is one of an impedance matrix, an admittance matrix, and a scattering matrix of said electrical component.

8. The method of claim 6, wherein said independent variable s is one of a frequency, a time, and a discrete z-domain.

9. The method of claim 6, wherein each element of said matrices $R_m$ and D is one of said parameters $p_1, \ldots, p_K$.

10. The method of claim 9, wherein said equation 1.3 is $$\left(\sum_{m=1}^{n} \frac{\Delta R_m}{s - a_m} + \Delta D\right) \frac{t_i(s)}{|\lambda_i(s)|} \cong 0 \text{ for } i = 1 \ldots n. \quad [8.1]$$

11. The method of claim 6, wherein each eigenvalue of said matrices $R_m$ and D is one of said parameters $p_1, \ldots, p_K$.

12. The method of claim 7, wherein said equation 1.3 is $$\left(\sum_{m=1}^{n} \frac{\Delta R_m}{s - a_m} + \Delta D\right) \frac{t_i(s)}{|\lambda_i(s)|} \cong 0 \text{ for } i = 1 \ldots n. \quad [8.1]$$

13. The method of claim 6, wherein said equation 1.3 is $$\left(\sum_{m=1}^{n} \frac{\Delta R_m}{s - a_m} + \Delta D\right) \frac{t_i(s)}{|\lambda_i(s)|} \cong 0 \text{ for } i = 1 \ldots n. \quad [8.1]$$

14. The method of claim 13, comprising finding an approximate solution of said equation 1.3 by minimizing a measure of each vector element in said equation 1.3.

15. The method of claim 13, comprising finding an approximate solution of said equation 1.3 by minimizing the sum of the squares of each vector element in said equation 1.3.

16. The method of claim 1, comprising finding an approximate solution of said equation 1.3 by minimizing a measure of each vector element in said equation 1.3.

17. The method of claim 1, comprising finding an approximate solution of said equation 1.3 by minimizing the sum of the squares of each vector element in said equation 1.3.

18. The method of claim 1, wherein said matrix Y is one of an impedance matrix, an admittance matrix, and a scattering matrix of said electrical component.

19. The method of claim 18, wherein said independent variable s is one of a frequency, a time, and a discrete z-domain.

20. The method of claim 1, wherein said independent variable s is one of a frequency, a time, and a discrete z-domain.

* * * * *